United States Patent

Asano et al.

[11] Patent Number: 6,094,984
[45] Date of Patent: Aug. 1, 2000

[54] ACCELERATION SENSOR WITH A CIRCUIT BOARD SEPARATED FROM A BASE PLATE BY A SPACE

[75] Inventors: Hiroshi Asano; Jun Tabota; Muneharu Yamashita; Toshihiro Mizuno; Masayuki Ichimaru, all of Nagaokakyo, Japan

[73] Assignee: Murata Manufacturing Co., Ltd., Japan

[21] Appl. No.: 08/925,896

[22] Filed: Sep. 8, 1997

Related U.S. Application Data

[63] Continuation of application No. 08/725,347, Oct. 1, 1996, abandoned, which is a continuation of application No. 08/336,187, Nov. 8, 1994, abandoned.

[30] Foreign Application Priority Data

| Nov. 9, 1993 | [JP] | Japan | 5-279420 |
| Nov. 9, 1993 | [JP] | Japan | 5-279421 |
| Nov. 12, 1993 | [JP] | Japan | 5-283635 |
| Nov. 16, 1993 | [JP] | Japan | 5-286663 |
| Nov. 16, 1993 | [JP] | Japan | 5-286664 |

[51] Int. Cl.[7] .................................................. G01P 1/02
[52] U.S. Cl. ............................................ 73/493; 73/514.16
[58] Field of Search ........................ 73/493, 431, 514.16, 73/514.34

[56] References Cited

U.S. PATENT DOCUMENTS

| 4,700,973 | 10/1987 | Gademann et al. | 280/735 |
| 5,003,824 | 4/1991 | Fukada et al. | 73/514.34 |
| 5,038,613 | 8/1991 | Takenaka et al. | 73/510 |
| 5,058,430 | 10/1991 | Aske | 73/497 |
| 5,088,326 | 2/1992 | Wada et al. | 73/517 |
| 5,095,751 | 3/1992 | Wada et al. | 73/517 |
| 5,233,871 | 8/1993 | Schwarz et al. | 73/493 |
| 5,379,640 | 1/1995 | Yamamoto | 73/517 R |
| 5,410,915 | 5/1995 | Yamamoto | 73/517 R |
| 5,415,044 | 5/1995 | Yamamoto | 73/517 R |

FOREIGN PATENT DOCUMENTS

| 0550037 | 7/1993 | European Pat. Off. . |
| 2150567 | 12/1990 | Japan . |
| 2150568 | 12/1990 | Japan . |
| 34268 | 1/1991 | Japan . |
| 2262613 | 6/1993 | United Kingdom . |

OTHER PUBLICATIONS

Sensor Technology, vol. 13, No. 11, ISSN 0285–5348, pp. 94–113 (1993).
"Airbag Sensor with Piezolectric Ceramic", Toshihiro Mizuno, Murata Mfg. Co., Ltd., pp. 1–12.
European Search Report dated Mar. 10, 1995.

*Primary Examiner*—Helen C. Kwok
*Attorney, Agent, or Firm*—Ostrolenk, Faber, Gerb & Soffen, LLP

[57] ABSTRACT

An acceleration sensor 1 comprises a circuit board 3 on which an acceleration detecting element 2 is carried. A plurality of connecting terminals 4 arranged along the periphery of the circuit board 3 are projected outward after penetrating through a metal base plate 5. The metal base plate 5 is fixed to the connecting terminals 4 spaced apart from the circuit board 3 by a predetermined distance in a state being insulated from the connecting terminals 4. The peripheral edge of the metal base plate 5 is connected to a case 7 covering the entire acceleration sensor 1. Circuit elements constituting a signal processing circuit for processing a detection signal of the acceleration detecting element 2 are arranged on the upper surface and the lower surface of the circuit board 3.

21 Claims, 12 Drawing Sheets

ACCELERATION SENSOR WITH A CIRCUIT BOARD SEPARATED FROM A BASE PLATE BY A SPACE

This is a Continuation of application Ser. No. 08/725,347 filed on Oct. 1, 1996 now abandoned.

This is a Continuation of application Ser. No. 08/336,187 filed on Nov. 8, 1994 now abandoned.

BACKGROUND OF THE INVENTION

1. Field of the invention

The present invention relates to the construction of an acceleration sensor particularly for use in an air bag system for an automobile.

2. Description of the Prior Art

One example of a conventional acceleration sensor is illustrated in FIG. 1. A conventional acceleration sensor 50 comprises an acceleration detecting element 51, a circuit board 52, a plurality of connecting terminals 53, a metal base plate 54, a metal cap 55, and insulating projections 56. The acceleration detecting element 51 is an element for detecting acceleration, converting the acceleration into an electric signal and outputting the electric signal and is carried on the circuit board 52. A signal processing circuit (not shown) for processing an acceleration signal detected by the acceleration detecting element 51 is also carried on the circuit board 52. An output of the signal processing circuit carried on the circuit board 52 is outputted outward from the acceleration sensor 50 through the plurality of connecting terminals 53. The circuit board 52 is bonded and fixed to the surface of the metal base plate 54. Each of the plurality of connecting terminals 53 has its end fixed to the circuit board 52 and the other end projected from the reverse surface of the metal base plate 54 after penetrating through the metal base plate 54. The metal cap 55 is fixed to a peripheral edge of the metal base plate 54 to cover the entire acceleration sensor 50. The connecting terminal 53 is insulated from the metal base plate 54 and is fixed to the metal base plate 54 in a portion, through which the connecting terminal 53 penetrates, of the metal base plate 54.

The acceleration sensor 50 is mounted on the surface of a mounting substrate 60 by inserting the plurality of connecting terminals 53 through mounting holes (not shown) of the mounting substrate 60 and connecting and fixing the connecting terminals 53 and a wiring pattern of the mounting substrate 60 to each other by soldering.

The conventional acceleration sensor 50 is used for detecting the change in acceleration in the travel direction of an automobile when it is used in an air bag system for an automobile, for example. However, vibration from a road surface and various types of vibration from the engine and the like are transmitted to the acceleration sensor 50 when it is carried on the body of the automobile. Such vibration may, in some cases, cause harmful vibration in the mounting substrate 60 and in the acceleration sensor 50. For example, if vibration in a bending mode is produced in the mounting substrate 60 by some external force, the mounting substrate 60 will be mechanically strained. If the mounting substrate 60 is strained, the effect of the strain is transmitted to the metal base plate 54 through the connecting terminals 53, whereby the metal base plate 54 is deformed. The deformation of the metal base plate 54 is further transmitted to the acceleration detecting element 51 through the circuit board 52 bonded to the surface of the metal base plate 54, to affect the acceleration detecting element 51. As a result, a malfunction occurs in the acceleration detecting element 51, whereby output sensitivity in a direction other than the direction in which acceleration is to be detected, for example, sensitivity in the other axial direction is produced, causing a malfunction in the air bag system.

Thus, a malfunction may occur due to the harmful vibration of the mounting substrate 60 in the conventional acceleration sensor 50 shown in FIG. 1.

SUMMARY OF THE INVENTION

An object of the present invention is to provide an acceleration sensor capable of restraining a malfunction due to the effect of harmful vibration from a substrate in a mounted state.

In accordance with a front aspect of the present invention, an acceleration sensor comprises an acceleration detecting element, a circuit board on which the acceleration detecting element is carried, a base plate arranged opposed to the circuit board while being separated from the circuit board by a space, and a connecting terminal extending from the circuit board, projected outward after penetrating through the base plate, and insulated from and fixed to the base plate.

In the acceleration sensor, the base plate and the circuit board are arranged opposed to each other while being separated from each other by the space. If vibration in a bending mode, for example, is produced in a substrate on which the acceleration sensor is carried, therefore, deformation due to the warping of the substrate is transmitted to the base plate, the connecting terminal, and the circuit board in this order. A portion of the connecting terminal between the base plate and the circuit board is deformed, whereby the influence of warping and deformation from the substrate is hardly transmitted to the circuit board. Consequently, it is possible to prevent situations where a malfunction occurs in the acceleration detecting element carried on the circuit board due to the influence of unnecessary vibration produced in the substrate.

In an acceleration sensor according to a restricted aspect of the present invention, the acceleration detecting element is carried in the center position of a major surface of the circuit board. Even when acceleration in the plane direction of the circuit board in the acceleration sensor is applied, therefore, no turning moment to rotate the circuit board is generated. Consequently, it is possible to prevent the production of unnecessary sensitivity due to the rotational vibration of the circuit board, so the acceleration detecting accuracy is improved.

In an acceleration sensor according to another aspect of the present invention, a substrate supporting member is arranged between the circuit board and the base plate. The substrate supporting member is arranged on the base plate for fixing and supporting the bottom surface of the circuit board. Therefore, a circuit board supporting structure becomes firmer, as compared with a structure in which a portion between a circuit board and a base plate is supported by only connecting terminals. Consequently, it is possible to prevent the circuit board from resonating under external vibration and prevent the acceleration detecting accuracy from being decreased by addition of noise due to the resonance in response to an acceleration detecting signal of the acceleration detecting element.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
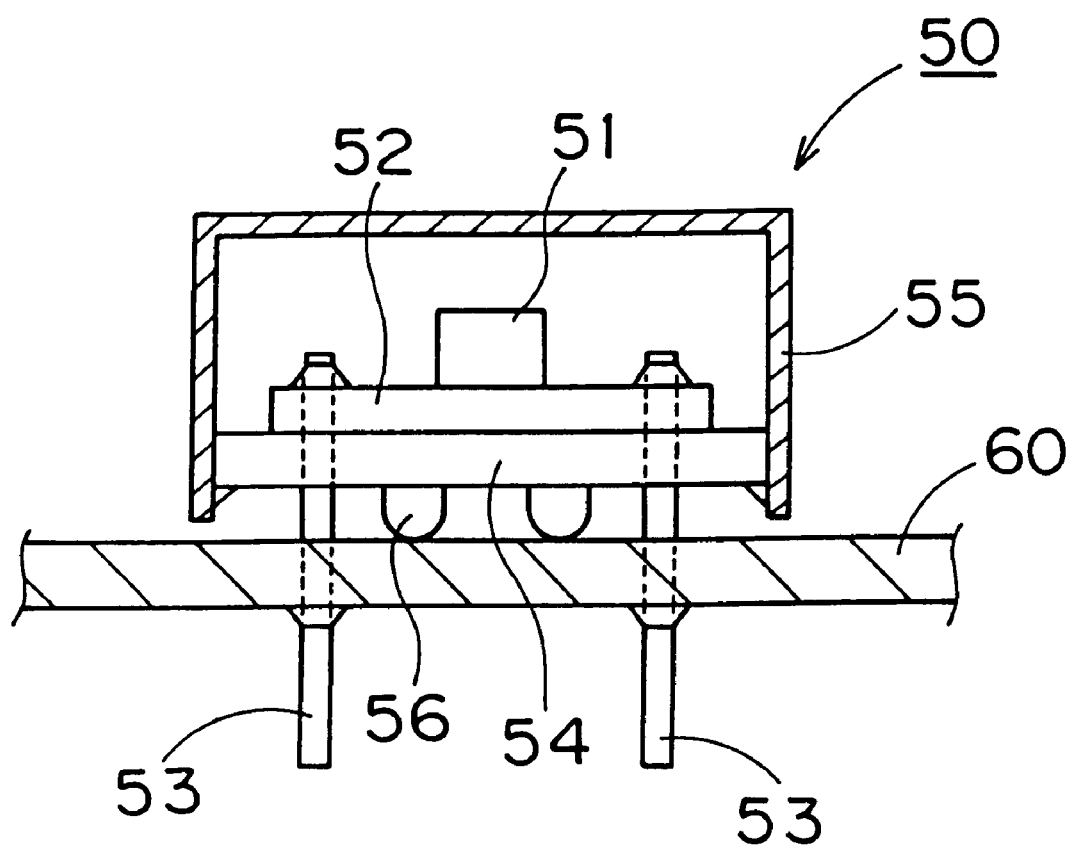
FIG. 1 is cross sectional view showing the construction of a conventional acceleration sensor.

Preferred embodiments of the present invention will be described in detail with reference to the drawings.

First Embodiment

As shown in FIGS. 2 to 5, an acceleration sensor 1 according to a first embodiment comprises an acceleration detecting element 2, a circuit board 3 on which a signal processing circuit for processing an acceleration signal detected by the acceleration detecting element 2 is carried, a plurality of connecting terminals 4 each having one end connected to the signal processing circuit on the circuit board 3 and the other end projected toward the reverse surface of the circuit board 3, a metal base plate 5, a metal cap 7 connected to the metal base plate 5 for covering the entire acceleration sensor 1, and insulating projections 6 formed on the reverse surface of the metal base plate 5. The reverse surface of the circuit board 3 may support other circuit elements E.

Figure 6:
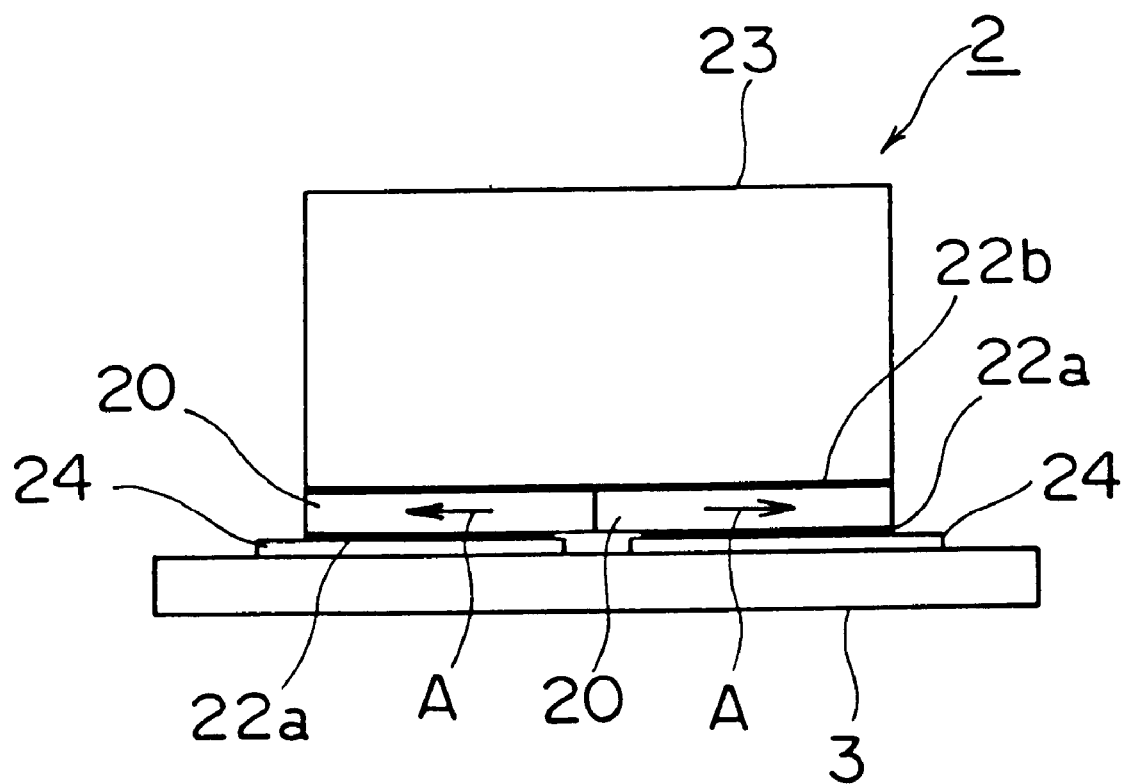
FIG. 6 is a diagram showing the construction of an acceleration detecting element in the acceleration sensor shown in FIG. 2.

The acceleration detecting element 2 is carried on the surface of the circuit board 3 incorporating the signal processing circuit (not shown), and comprises a pair of piezoelectric elements 20 arranged adjacent to each other and a weight 23 mounted on the pair of piezoelectric elements 20, as shown in FIG. 6. The pair of piezoelectric elements 20 are fabricated using piezoelectric ceramics. The piezoelectric elements 20 are integrated by joining their side surfaces to each other with adhesives. Further, each of the piezoelectric elements 20 is subjected to polarization processing in the direction in which acceleration is exerted, and the direction of polarization A in the piezoelectric element 20 is set in a direction parallel to a major surface of the circuit board 3 and coincides with the main axial direction of sensitivity in which detection sensitivity to acceleration is the highest. The weight 23 is fabricated using piezoelectric ceramics which is not subjected to polarization processing. A common electrode 22b is formed on the upper surfaces of the integrated piezoelectric elements 20. The common electrode 22b and the weight 23 are joined to each other through adhesives. On the other hand, element electrodes 22a are respectively formed on the lower surfaces of the piezoelectric elements 20. The element electrodes 22a are respectively connected to electrode lands 24 formed on the surface of the circuit board 3 through adhesives.

The acceleration detecting element 2 utilizes as the principle of detection such a piezoelectric ceramics shearing effect that the weight 23 of large mass produces an inertia force by application of acceleration and shear stresses are respectively applied to the piezoelectric elements 20 by the weight 23 and consequently, a charge and a voltage proportional to the acceleration are produced. Since the weight 23 is composed of piezoelectric ceramics which is not subjected to polarization processing, the weight 23 functions only as an object of large mass which produces an inertial force based on acceleration and applies shear stresses to the piezoelectric elements 20. The weight 23 is not limited to one composed of piezoelectric ceramics. The weight 23 may be one fabricated using a material having approximately the same coefficient of thermal expansion as that of the piezoelectric elements 20. This is for the following reason. Specifically, in the step of mounting the acceleration detecting element 2, a method of overlapping the circuit board 3 composed of alumina and the piezoelectric elements 20 composed of piezoelectric ceramics and overlapping the piezoelectric elements 20 and the weight 23 with thermosetting adhesives respectively interposed therebetween and then, simultaneously bonding them to each other by one heating processing may, in some cases, be used. This method will be described in detail later. In this case, if the weight 23 is composed of a material such as iron and the piezoelectric elements 20 are composed of piezoelectric ceramics as in the conventional example, an internal stress is produced in a portion where they are bonded after heating due to the difference in the coefficient of thermal expansion therebetween. In the present embodiment, therefore, the piezoelectric elements 20 and the weight 23 are fabricated using materials having approximately the same coefficient of thermal expansion. This restrains the variation in detection characteristics due to the internal stress based on the difference in the coefficient of thermal expansion.

The acceleration detecting element 2 is fabricated by the following method.

Figure 7:
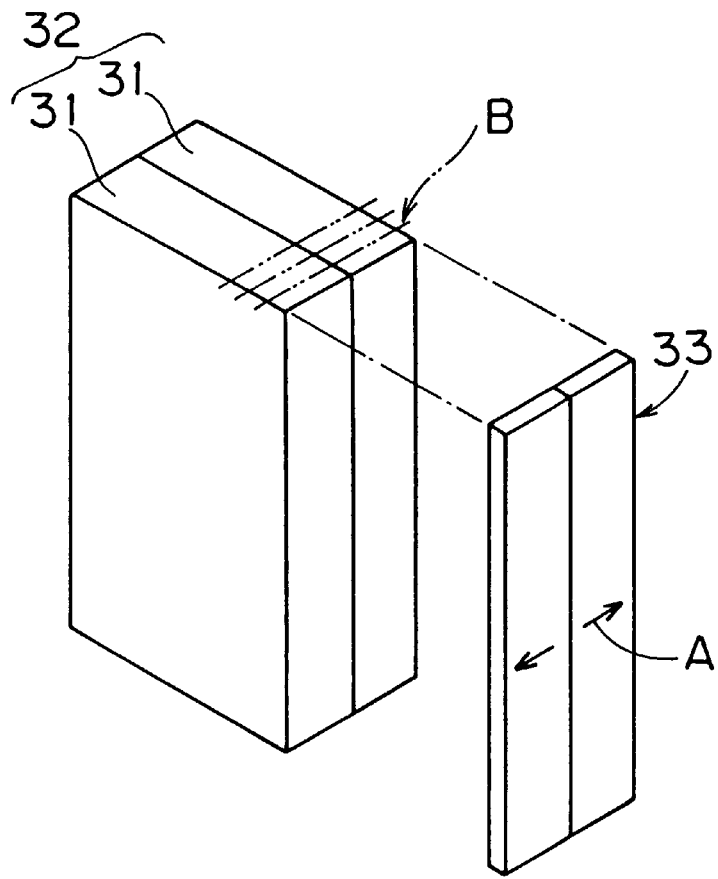
FIG. 7 is a perspective view showing one step out of steps of fabricating the acceleration detecting element shown in FIG. 6.

As shown in FIG. 7, a pair of block members 31 composed of piezoelectric ceramics which is previously subjected to polarization processing is first prepared, and the block members 31 are integrated by joining their respective one surfaces to each other with adhesives. A block joint member 32 obtained by the integration is subjected to cutting processing along imaginary lines B as shown, to cut a ceramic joint plate 33 having a predetermined thickness. The ceramic joint plate 33 corresponds to the pair of piezoelectric elements 20, 20 shown in FIG. 6.

Figure 8:
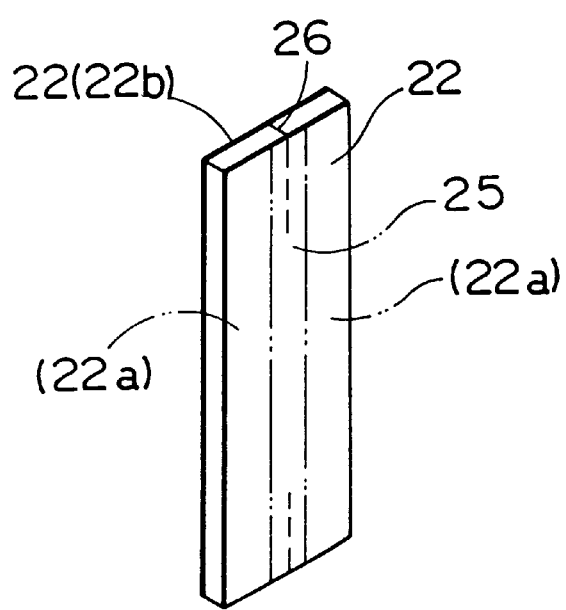
FIG. 8 is a perspective view showing another step out of the steps of fabricating the acceleration detecting element shown in FIG. 6.

As shown in FIG. 8, both major surfaces of the ceramic joint plate 33 are subjected to electrode formation processing such as deposition or sputtering, to form electrode layers 22 having a predetermined thickness on the entire surfaces of the ceramic joint plate 33.

Figure 9:
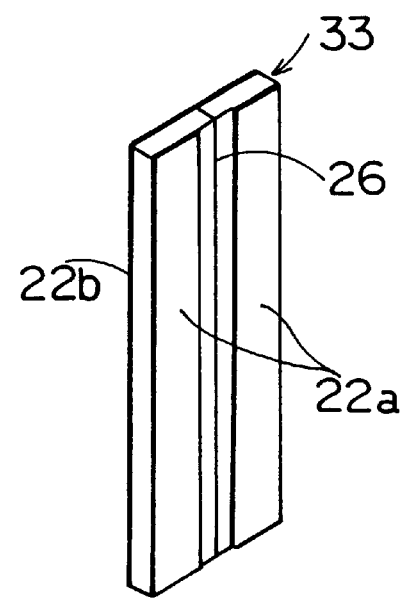
FIG. 9 is a perspective view showing still another step out of the steps of fabricating the acceleration detecting element shown in FIG. 6.

An electrode region 25 extending along a joint surface 26 of the ceramic joint plate 33 with a predetermined width in the electrode layer 22 formed on one major surface of the ceramic joint plate 33 is cut and removed using a groove processing tool which is referred to as a dicing machine. A pair of element electrodes 22a separated from each other is formed, as shown in FIG. 9, by the removal processing. In performing the removal processing of the electrode region 25 having a predetermined with using the dicing machine, a cutting region is positioned on the basis of the joint surface 26 of the ceramic joint plate 33, thereby to make it possible to perform cutting processing in an accurate width. Therefore, the element electrodes 22a separated from each other by the cutting and removal processing can be formed in symmetrical positions spaced apart from the joint surface 26 by an equal distance. This removal processing is not limited to the cutting processing using the dicing machine. The removal processing may be performed using a method such as etching, provided that the dimensional precision of the electrode region 25 having a predetermined width can be maintained.

Figure 10:
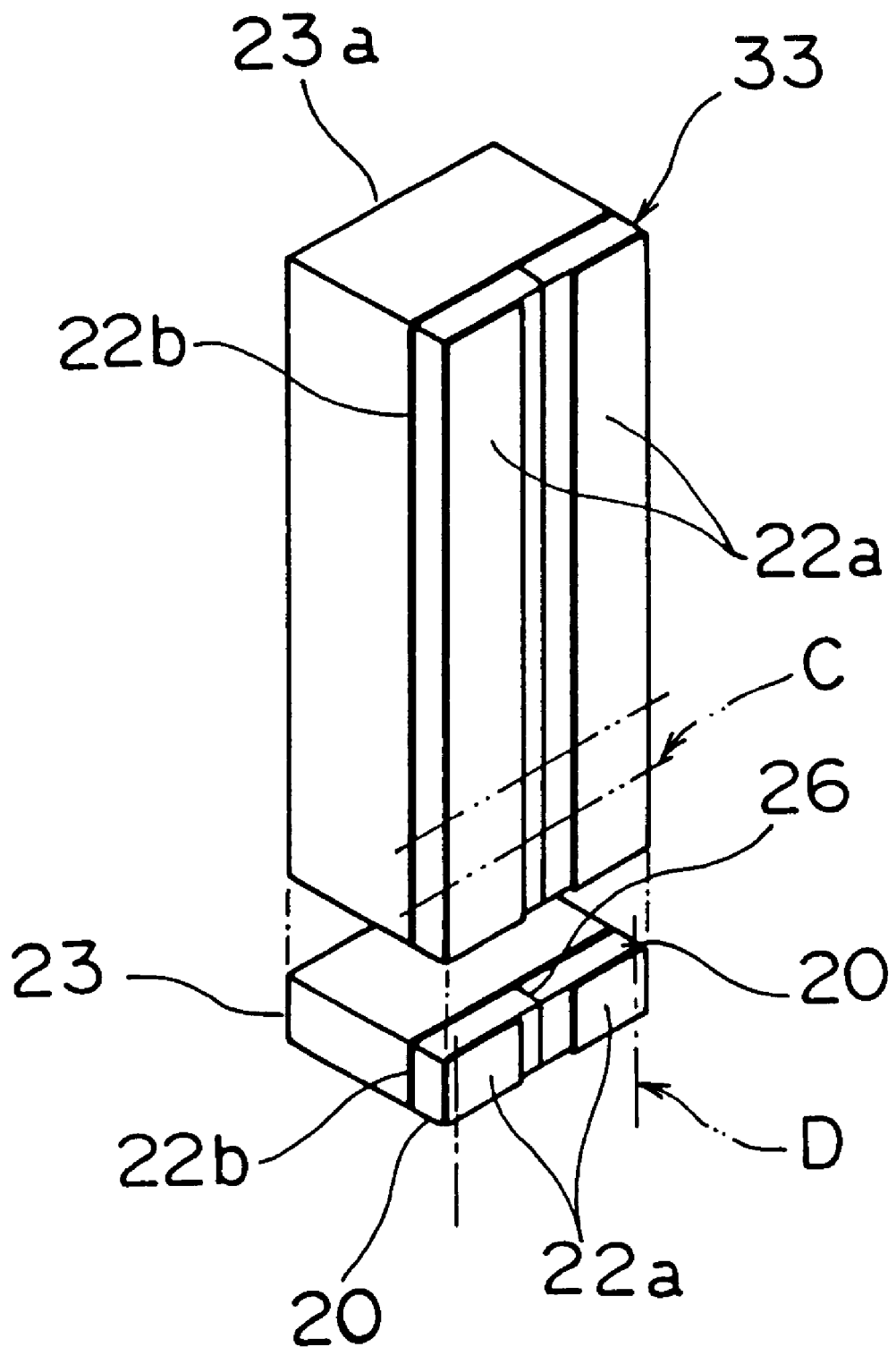
FIG. 10 is a perspective view showing a further step out of the steps of fabricating the acceleration detecting element shown in FIG. 6.

Furthermore, as shown in FIG. 10, a weight block member 23a composed of piezoelectric ceramics which is not subjected to polarization processing is joined with adhesives to a major surface, on which the common electrode 22b is formed, of the ceramic joint plate 33. Thereafter, the ceramic joint member 33 and the weight block member 23a which are integrated by the joining are cut to predetermined widths along imaginary lines C as shown. Further, both ends of each of chips of the ceramic joint plate 33 and the weight 23 obtained by the cutting are cut off along imaginary lines D as shown, to adjust the dimensions of the chip. The cutting of both the ends of the chip along the imaginary lines D is performed on the basis of not the joint surface 26 of the pair of piezoelectric elements 20 but an inner end surface of the element electrode 22a obtained by the cutting using the dicing machine. Specifically, the internal end surface of the element electrode 22a is formed in a linear shape by the cutting processing. Consequently, the internal end surface is suitable for use as a reference position in cutting off both the ends of the chip. If both the ends of the chip are cut off on the basis of the internal end surface, the widths of the element electrodes 22a obtained as a result of the cutting become equal to each other. As a result, it is possible to make the areas of the element electrodes 22a in the completed acceleration detecting element 2 equal to each other.

The acceleration detecting element 2 is completed by the foregoing steps. The acceleration detecting element 2 thus fabricated is mounted on a substrate by being joined to the electrode lands 24 formed on the surface of the circuit board 3 through adhesives.

The weight 23 and the pair of piezoelectric elements 20 in the acceleration detecting element 2 may be individually fabricated without using the above described fabricating method. Specifically, the weight 23 and the integrated piezoelectric elements 20 having the common electrode 22b and the element electrodes 22a formed thereon which constitute the acceleration detecting element 2 may be individually fabricated by cutting the ceramic joint plate 33 fabricated in the step shown in FIG. 9 to predetermined widths along the imaginary lines D shown in FIG. 10, while cutting the weight block member 23a composed of piezoelectric ceramics to the same widths. It is preferable in terms of fabrication efficiency that such a method is employed. In this case, the connection of the electrode lands 24 on the circuit board 3 and the pair of element electrodes 22a and the connection of the common electrode 22b and the weight 23 can be made by performing heating processing once using thermosetting adhesives, for example, in the step of mounting the acceleration detecting element 2 on the circuit board 3.

Figure 11:
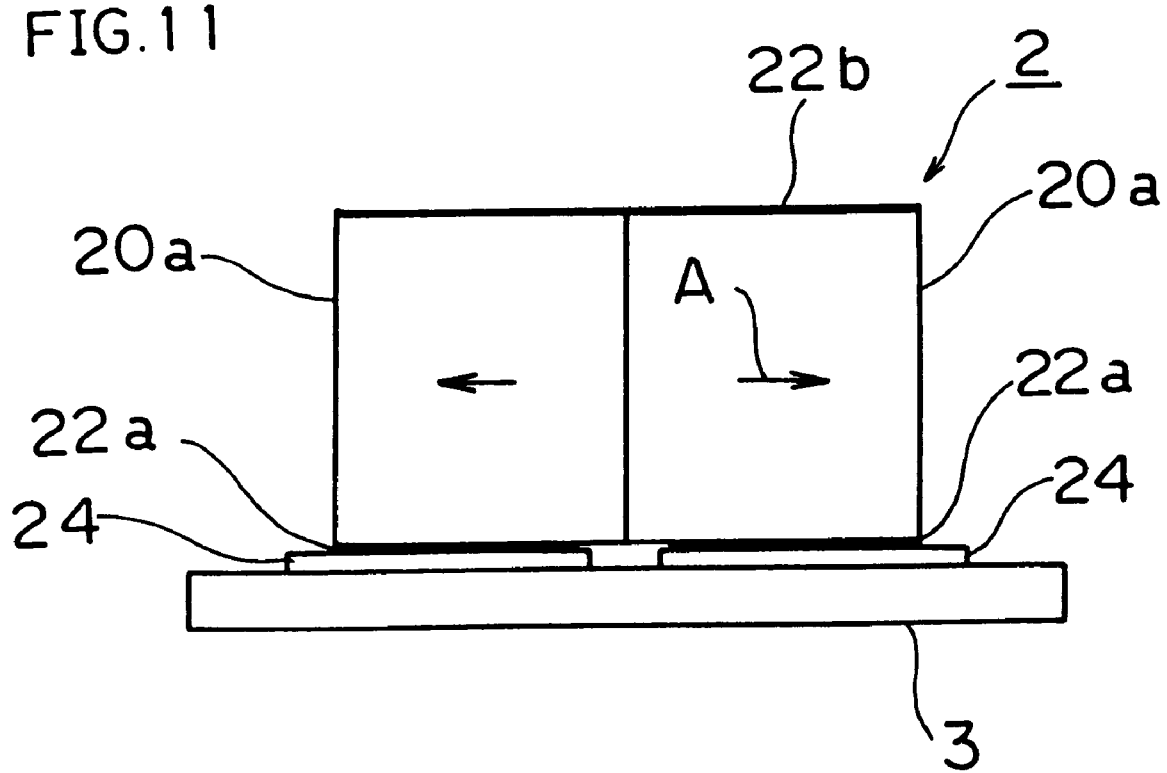
FIG. 11 is a diagram showing the construction of another example of the acceleration detecting element.

Furthermore, an acceleration detecting element 2 in another example which is applied to the present invention is shown in FIG. 11. The acceleration detecting element 2 does not comprise a weight 23, as compared with the acceleration detecting element 2 shown in FIG. 6. The acceleration detecting element 2 is so constructed that a pair of piezoelectric elements 20a also serves as the weight 23. Therefore, the pair of piezoelectric elements 20a is increased in height and mass. In the acceleration detecting element 2 thus constructed, each of the piezoelectric elements 20a produces an inertia force by its own weight if acceleration is exerted thereon and a shear stress is applied to the piezoelectric element 20a and consequently, a charge and a voltage proportional to the acceleration are produced, thereby to detect the acceleration.

In the acceleration detecting element 2, a ceramic joint plate 33 having a sufficient thickness may be cut from a block joint member 32 in the above described fabricating step shown in FIG. 7. In the subsequent steps, a common electrode 22b and element electrodes 22a may be formed using the same method as the above described method shown in FIGS. 8 to 10.

Description is now made of FIGS. 1 and 5 again. Particularly referring to FIG. 5, the acceleration detecting element 2 is arranged in the center of the circuit board 3. This is caused by the fact that the acceleration detecting element 2 has a higher weight than that of the other element arranged on the circuit board 3. If the acceleration detecting element 2 which is a heavy component is arranged in the center position O of the circuit board 3, it is possible to determine the center of gravity J of the entire circuit board 3 in the vicinity of the center position. If the acceleration detecting element 2 is thus arranged, it is possible to prevent a turning moment from being generated in the circuit board 3 if acceleration is applied to the acceleration sensor 1. For example, if the acceleration detecting element 2 which is a heavy component is arranged in the peripheral position of the circuit board 3, there occurs such a phenomenon that the center of gravity J of the circuit board 3 is offset from the center position O, whereby a turning moment is generated in the circuit board 3 so that the connecting terminals 4 are distorted, causing the rotational vibration of the circuit board 3. The rotational vibration degrades the detecting accuracy of the acceleration sensor 1 because it prevents acceleration from being accurately transmitted to the acceleration detecting element 2. As in the present embodiment, therefore, the acceleration detecting element 2 is arranged in the center position of the circuit board 3, thereby to make it possible to prevent the detecting accuracy of the acceleration sensor 1 from being decreased due to the rotational vibration. The acceleration detecting element 2 is so arranged that the direction in which acceleration is to be detected G is parallel to the plane direction of the circuit board 3 and is parallel to a direction orthogonal to the direction in which the connecting terminals 4 are aligned Y, that is, the direction in which the connecting terminals 4 are opposed to each other X.

A plurality of (for example, five) connecting terminals 4 are arranged in parallel along each of both side surfaces of the circuit board 3. One end of the connecting terminal 4 is connected to one terminal of the signal processing circuit formed on the circuit board 3. The other end of the connecting terminal 4 is projected toward the reverse surface of the metal base plate 5 after penetrating through the metal base plate 5.

The metal base plate 5 is arranged opposed to the circuit board 3 while being separated by a space S. The insulating projections 6 are provided on the reverse surface of the metal base plate 5. A portion, through which the connecting terminal 4 penetrates, of the metal base plate 5 is subjected to insulation processing. In addition, the metal cap 7 is attached to the metal base plate 5. As a result, the entire acceleration sensor 1 is covered with the metal cap 7.

The acceleration sensor 1 is mounted on a mounting substrate 10. Ends of the connecting terminals 4 are respectively inserted through mounting holes (not shown) of the mounting substrate 10 until the insulating projections 6 in the acceleration sensor 1 abut against the surface of the mounting substrate 10. In this state, the connecting terminals 4 are soldered to a wiring pattern (not shown) of the mounting substrate 10, whereby the acceleration sensor 1 is connect ed and fixed to the mounting substrate 10.

In the acceleration sensor 1 constructed as described above, the circuit board 3 is arranged spaced apart from the metal base plate 5 by a constant distance. Therefore, the following effect is produced.

Specifically, if unnecessary vibration (particularly, bending) is caused by some factor in the mounting substrate 10 to which the acceleration sensor 1 is fixed to warp the mounting substrate 10, the mechanical strain of the mounting substrate 10 is transmitted to the metal base plate 5, to warp the metal base plate 5. Since the space S is formed between the metal base plate 5 and the circuit board 3, however, mechanical strain due to the warping of the metal base plate 5 is transmitted to the circuit board 3 not directly but through the connecting terminals 4. However, the connecting terminals 4 are elastically deformed and curved, thereby to absorb the mechanical strain. Therefore, the mechanical strain is hardly transmitted to the circuit board 3. The influence of the warping of the mounting sub strate 10 is not transmitted to the circuit board 3 by such a function, whereby no unnecessary output (for example, sensitivity in the other axial direction) is produced from the acceleration detecting element 2.

Figure 2:
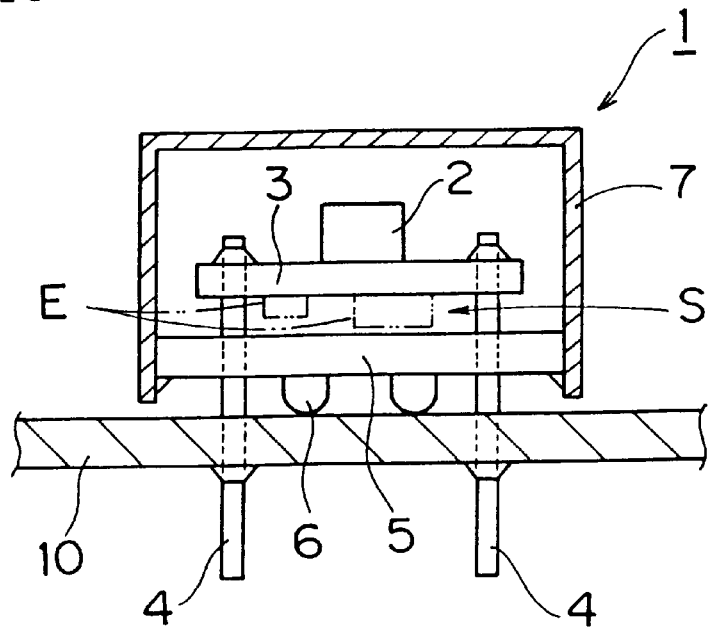
FIG. 2 is a cross sectional view showing the construction of an acceleration sensor according to a first embodiment of the present invention.
Figure 3:
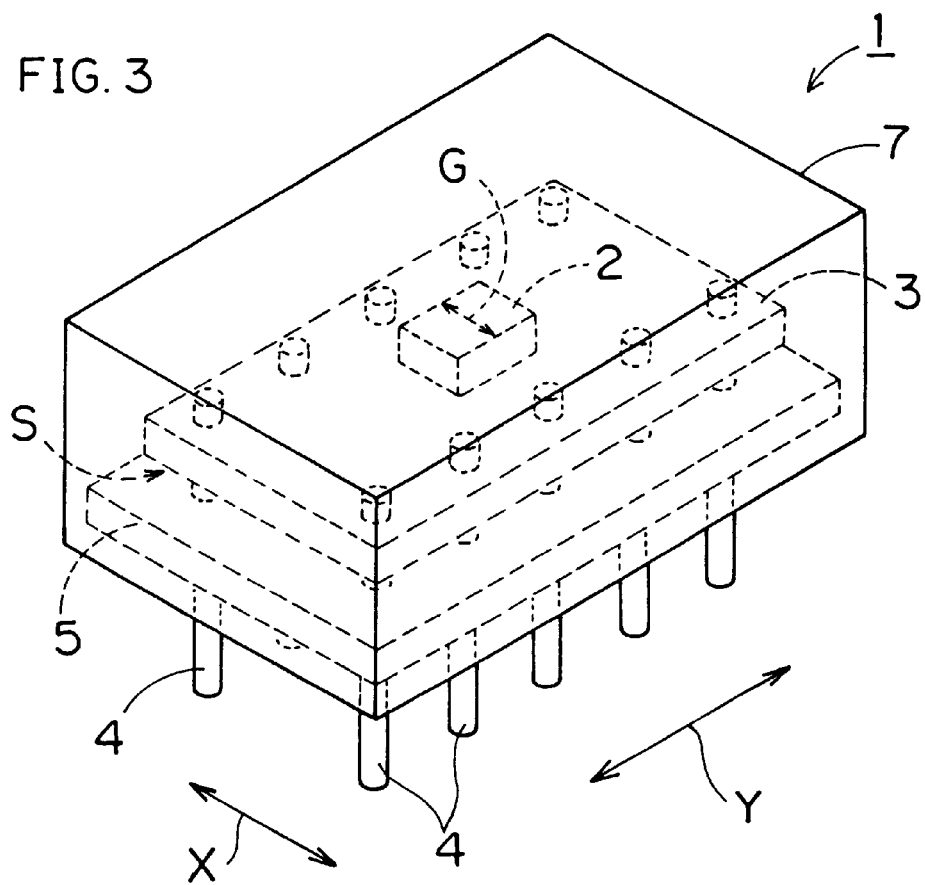
FIG. 3 is a perspective view showing the construction of the acceleration sensor shown in FIG. 2.
Figure 4:
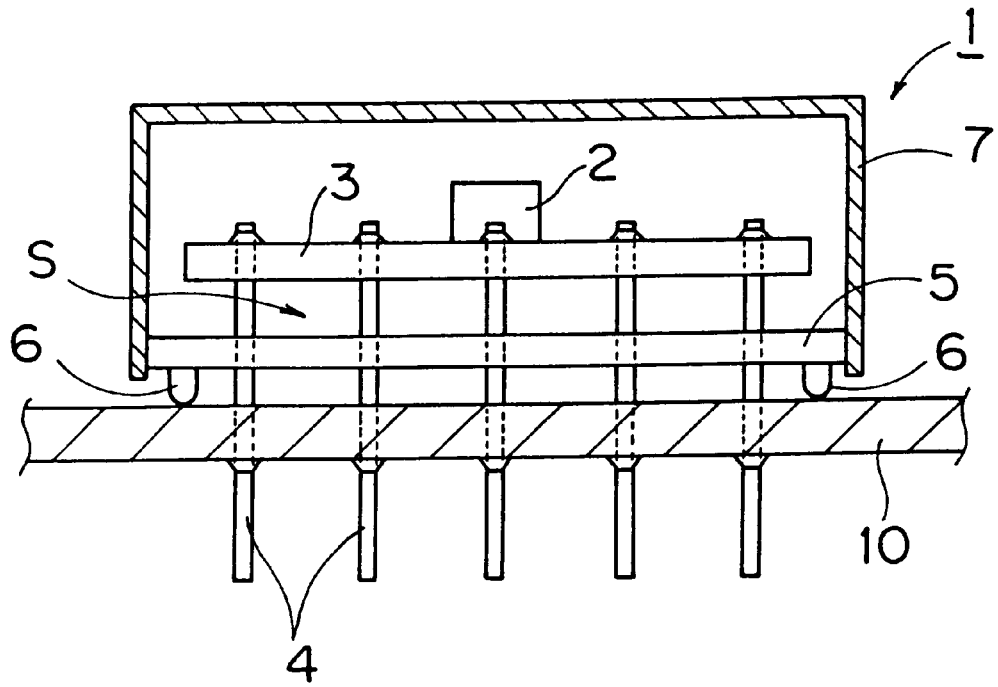
FIG. 4 is a front sectional view showing the construction of the acceleration sensor shown in FIG. 2.
Figure 5:
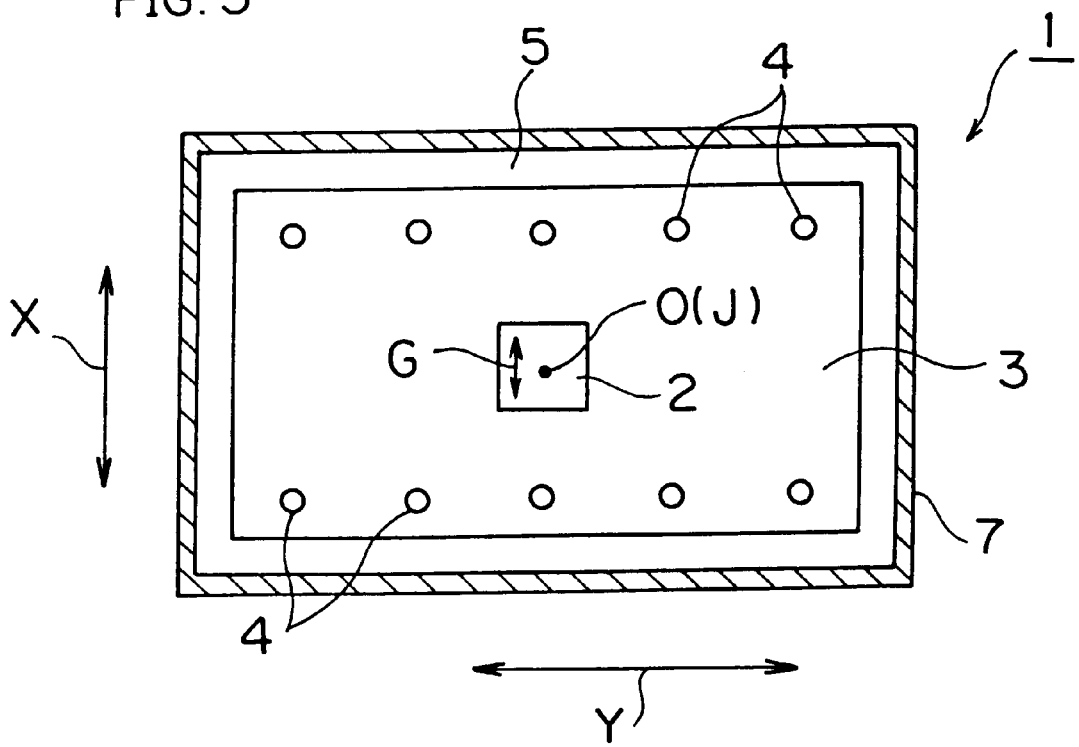
FIG. 5 is a plan view showing the construction of the acceleration sensor shown in FIG. 2.

As shown in FIG. 2, for example, in the acceleration sensor 1, the pair of connecting terminals 4 is arranged in parallel along a pair of end surfaces of the circuit board 3. Although the pair of connecting terminals 4 is relatively easily curved in the direction in which the connecting terminals 4 are opposed to each other X, therefore, the plurality of connecting terminals 4 are not easily curved in the direction in which the connecting terminals 4 are aligned Y. If the metal base plate 5 warps in the direction Y, the connecting terminals 4 can be hardly curved. Consequently, it is considered that the mechanical strain of the metal base plate 5 is transmitted to the circuit board 3, to warp the circuit board 3.

In order to prevent such a problem from occurring, in the acceleration sensor 1, the acceleration detecting element 2 is arranged on the circuit board 3 so that the direction in which acceleration is to be detected G is parallel to the direction in which the connecting terminals 4 are opposed to each other X, as described above. Even if the circuit board 3 warps by the warping of the metal base plate 5 in the direction in which the connecting terminals are aligned Y, therefore, strain due to the warping is hardly picked up by the acceleration detecting element 2 because the direction in which the strain is induced becomes a direction orthogonal to the direction in which acceleration is to be detected G in the acceleration detecting element 2. Therefore, unnecessary output (for example, sensitivity in the other axial direction) is hardly produced from the acceleration sensor 1.

As another effect produced by providing the space S, an element containing space can be formed on the reverse surface of the circuit board 3. Therefore, circuit elements E constituting the signal processing circuit are arranged in the element containing space, whereby elements can be arranged on the surface and the reverse surface of the circuit board 3, thereby to make it possible to reduce the area of the circuit board 3.

If the reverse surface of the circuit board 3 is not utilized as an element containing space, the space may be filled with elastic resin or the like. As the elastic resin, elastic resin having such a degree of suitable elasticity that the deformation of the metal base plate 5 is not directly transmitted to the circuit board 3 is preferred.

Description is now made of an effect produced by arranging the acceleration detecting element 2 which is a heavy component in the center position of the circuit board 3. The position where the acceleration detecting element 2 is arranged becomes a position which is approximately symmetrical with respect to the plurality of connecting terminals 4, as described above. Even if acceleration is applied to the acceleration sensor 1, therefore, no turning moment is generated in the circuit board 3. Consequently, such a phenomenon that the connecting terminals 4 are distorted by the turning moment to cause the rotational vibration of the circuit board 3 does not occur. Therefore, it is possible to prevent the detecting accuracy of the acceleration sensor 1 from being decreased by transmission of the rotational vibration of the circuit board 3 to the acceleration detecting element 2.

Even if the circuit board 3 warps by some factor, the direction of the tangent in the center position of the circuit board 3 is maintained in an approximately horizontal state. On the contrary, if the acceleration detecting element 2 is arranged in the peripheral portion of the circuit board 3 as in the conventional example, the acceleration detecting element 2 is inclined by the warping of the circuit board 3. If the acceleration detecting element 2 is inclined, the direction in which the acceleration detecting element 2 detects acceleration is displaced from the direction in which acceleration is to be detected G initially set to detect acceleration in a direction other than the direction to be inherently detected, thereby producing unnecessary sensitivity. On the other hand, in the acceleration sensor 1 according to the present embodiment, the acceleration detecting element 2 is arranged in the center position of the circuit board 3. Even if the circuit board 3 warps, therefore, the direction in which the acceleration detecting element 2 is mounted is not inclined, and the direction in which acceleration is to be detected G is also maintained in a state parallel to the circuit board 3. Therefore, unnecessary vibration due to bending is not detected as an acceleration component in the direction in which acceleration is to be detected G in the acceleration detecting element 2. Consequently, unnecessary sensitivity is not produced in the acceleration detecting element 2.

Such bending of the circuit board 3 is also produced when unnecessary vibration such as bending produced in the mounting substrate 10 is transmitted to the circuit board 3. Even in any case, however, the direction in which acceleration is to be detected G in the acceleration detecting element 2 is maintained in a state parallel to the circuit board 3. Consequently, unnecessary vibration due to the bending produced in the circuit board 3 is not detected as an acceleration component in the direction in which acceleration is to be detected G in the acceleration detecting element 2. Such unnecessary sensitivity due to the warping of the circuit board 3 is produced irrespective of the direction in which acceleration is to be detected G in the acceleration detecting element 2. If the direction in which acceleration is to be detected G in the acceleration detecting element 2 is parallel to the circuit board 3 as in the acceleration sensor 1 according to the present embodiment, the unnecessary sensitivity is significantly produced. Therefore, the present embodiment in which the position where the acceleration detecting element 2 is arranged is improved is high in effectively.

Figure 12:
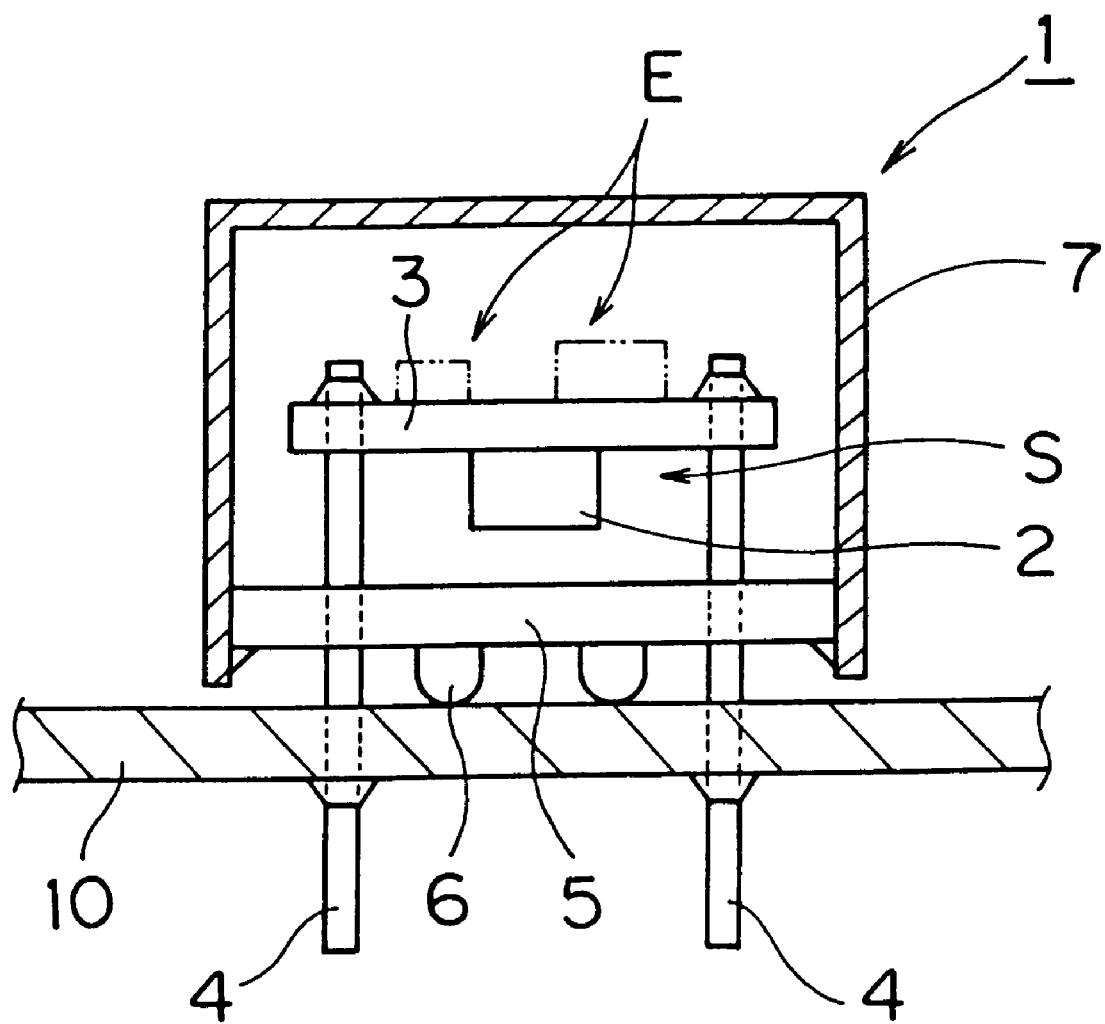
FIG. 12 is a cross sectional view showing the construction of an acceleration sensor in a modified example of the first embodiment.

A modified example shown in FIG. 12 is applicable to the above described acceleration sensor 1 according to the first embodiment. In an acceleration sensor 1 according to the modified example, an acceleration detecting element 2 is arranged on the reverse surface of a circuit board 3. The obverse surface may support other circuit elements E. The acceleration detecting element 2 is fixed on the reverse surface of the circuit board 3 so that piezoelectric elements 20 are connected to a wiring pattern formed on the reverse surface of the circuit board 3. This arrangement produces the effect of preventing the acceleration detecting element 2 from being stripped from the circuit board 3 because if the acceleration sensor 1 drops with the upper side of a metal cap 7 down, for example, a weight 23 in the acceleration detecting element 2 applies a load in the direction in which the piezoelectric elements 20 are pressed against the circuit board 3 by the impact of the drop. If the acceleration sensor 1 drops with the side of the connecting terminals 4 down, the impact of the drop is alleviated by the connecting terminals 4. Therefore, the stripping of the acceleration detecting element 2 is not a problem.

A structure in which the acceleration detecting element 2 is arranged on the lower surface of the circuit board 3 is also applicable to embodiments subsequently described.

Second Embodiment

Figure 13:
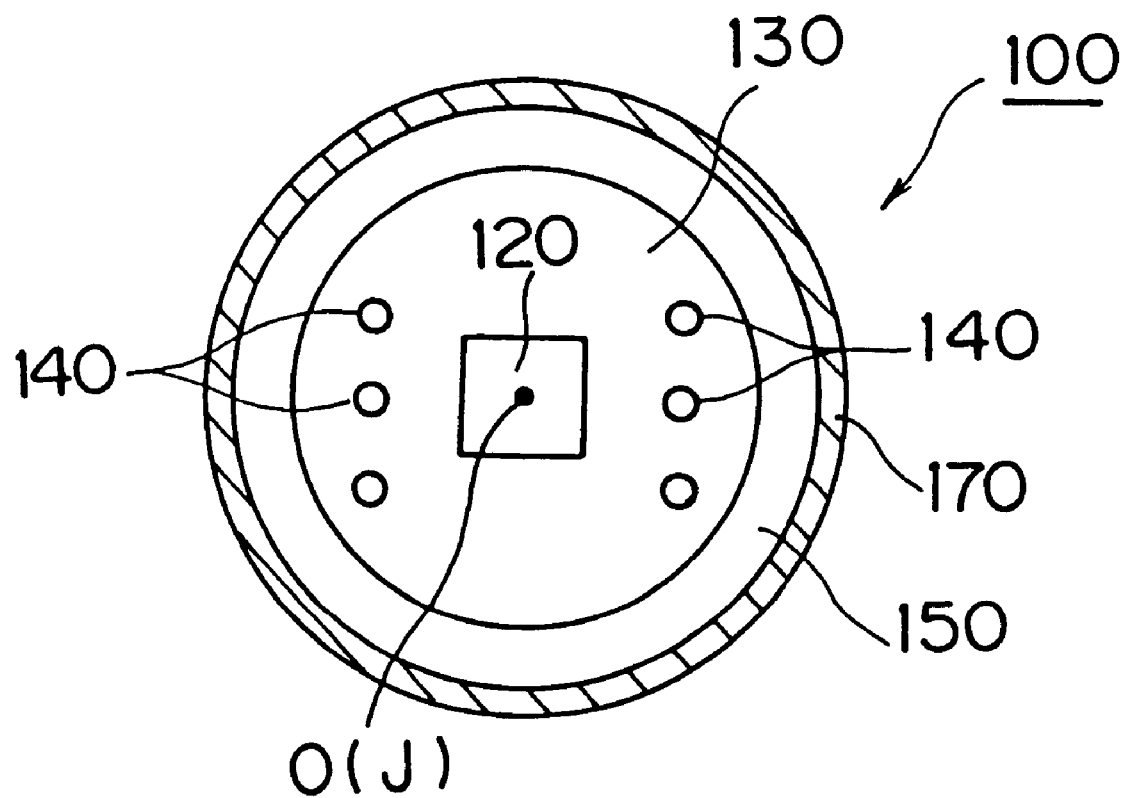
FIG. 13 is a plan view showing the construction of an acceleration sensor according to a second embodiment of the present invention.

FIG. 13 illustrates the horizontal sectional construction of an acceleration sensor 100 according to a second embodiment of the present invention. In the acceleration sensor 100 according to the present embodiment, a circuit board 130, a metal base plate 150 and a metal cap 170 are respectively constructed in circular shapes. Holes 140 are provided in the circuit board 130 for receiving connecting terminals (not shown). An acceleration detecting element 120 is arranged in the center position O of the circuit board 130 in a circular shape. In this case, the acceleration detecting element 120 is arranged in the center position of the circuit board 130, similarly to the acceleration sensor 1 according to the first embodiment, thereby to make it possible to restrain the generation of a turning moment due to acceleration applied to the acceleration sensor 100. Further, it is possible to prevent the direction in which acceleration is to be detected G from being inclined due to the warping of the circuit board 130.

Third Embodiment

A third embodiment and the subsequent embodiments are characterized in that a resonance preventing structure of a circuit board is further added to the first embodiment.

Figure 14:
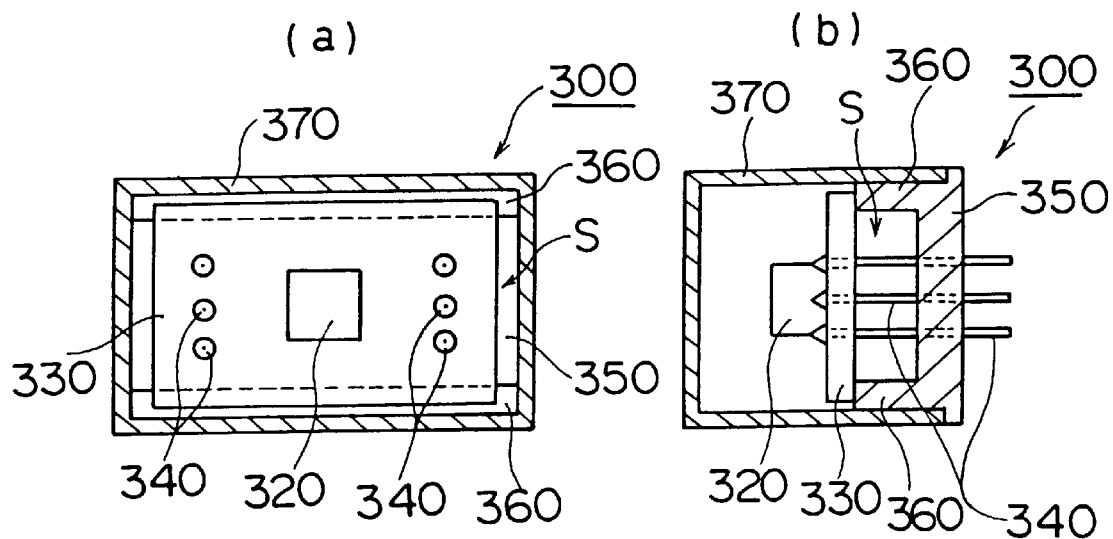
FIG. 14(a) is a plan view showing the construction of an acceleration sensor according to a third embodiment of the present invention.
FIG. 14(b) is a sectional side elevation thereof.

As shown in FIG. 14, an acceleration sensor 300 according to the third embodiment comprises an acceleration detecting element 320, a circuit board 330 in a rectangular shape on which a signal processing circuit (not shown) for processing an acceleration signal detected by the acceleration detecting element 320 is carried, three connecting terminals 340 arranged in parallel along each of a pair of short sides of the circuit board 330, a metal base plate 350 arranged on the side of the reverse surface of the circuit board 330, and a case 370 fixed to the metal base plate 350. The metal base plate 350 has a rectangular shape slightly larger than that of the circuit board 330, and a pair of substrate supporting portions 360 is integrally formed on a major surface, which is opposed to the circuit board 330, of the metal base plate 350. A space S is formed between the circuit board 330 and the metal base plate 350 by the substrate supporting portions 360. Parts of circuit components constituting the signal processing circuit can be carried on the reverse surface of the circuit board 330 by providing the space S, thereby to make it possible to reduce the area of the circuit board 330.

Each of the connecting terminals 340 is projected toward the reverse surface of the metal base plate 350 after penetrating through the metal base plate 350, and a portion between the connecting terminal 340 and the metal base plate 350 is subjected to insulation processing.

In the acceleration sensor 300, both ends of the circuit board 330 are supported by the pair of substrate supporting portions 360 in the metal base plate 350. Even when external vibration is transmitted through the connecting terminals 340, therefore, the rolling of the circuit board 330 is restrained by a supporting structure using the substrate supporting portions 360. As a result, rolling resonance is prevented from being produced in the circuit board 330.

Specifically, if rolling resonance is produced in the circuit board 330, extra signals (noises) due to the resonance are included on the side of high frequencies of a measured region of the acceleration detecting element 320, thereby to degrade the acceleration measuring accuracy. Therefore, the prevention of the rolling resonance of the circuit board 330 to reduce the noises due to the resonance is effective in improving the measuring accuracy of the acceleration sensor 300.

Fourth Embodiment

Figure 15:
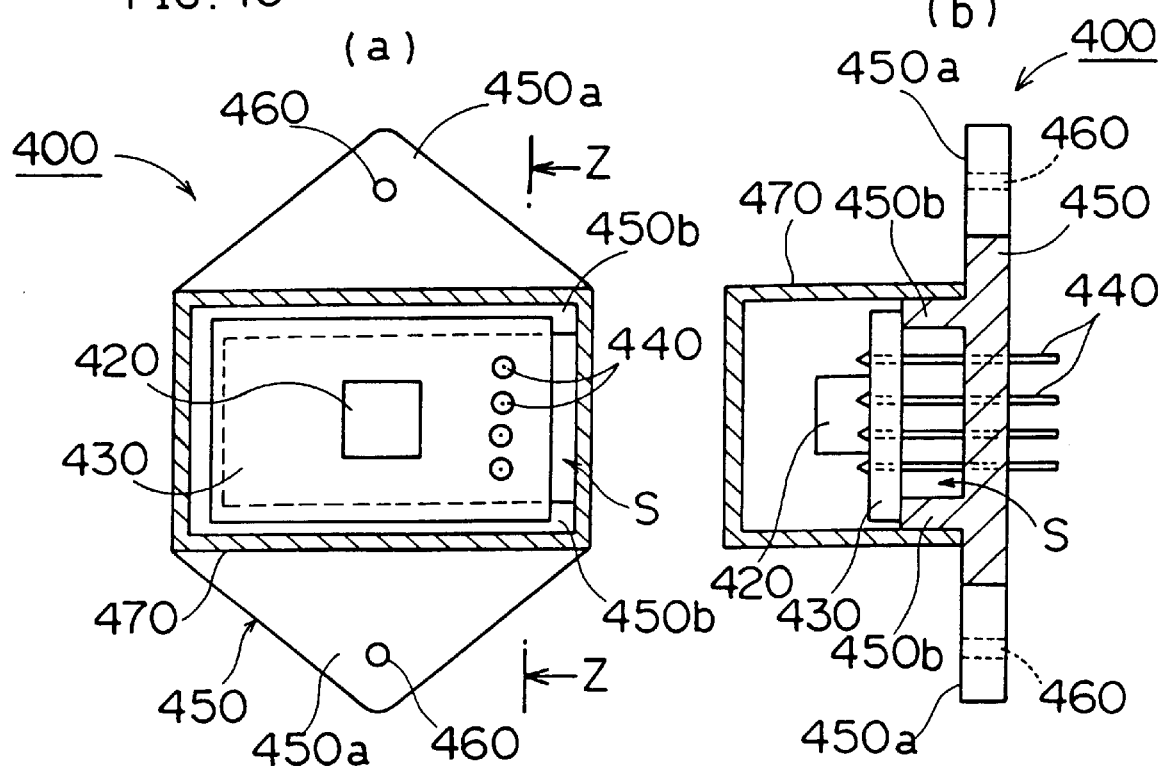
FIG. 15(a) is a plan view showing the construction of an acceleration sensor according to a fourth embodiment of the present invention.
FIG. 15(b) is a sectional side elevation taken along a line Z—Z in FIG. 15(a)

In an acceleration sensor 400 shown in FIG. 15, a plurality of (four in an example as shown) connecting terminals 440 are arranged along only one of short sides of a circuit board 430 in a rectangular shape. Each of the connecting terminals 440 is projected toward the reverse surface of the circuit board 430 after penetrating through a metal base plate 450.

The metal base plate 450 has flange portions 450*a* for mounting the acceleration sensor 400 on a substrate or the like. Mounting holes 460 are respectively formed in the flange portions 450a. The acceleration sensor 400 is fixed to a substrate or the like through the mounting holes 460. In addition, a substrate supporting portion 450b for supporting a peripheral edge of the circuit board 430 is integrally formed in the metal base plate 450. In FIG. 15(a), the substrate supporting portion 450b is formed in a U shape along three sides of the circuit board 430 excluding one side along which the connecting terminals 440 are formed. The substrate supporting portion 450b supports the circuit board 430, to prevent rolling resonance from being produced in the circuit board 430 to prevent the inclusion of noises due to the resonance of the circuit board 430, as in the third embodiment.

Fifth Embodiment

Figure 16:
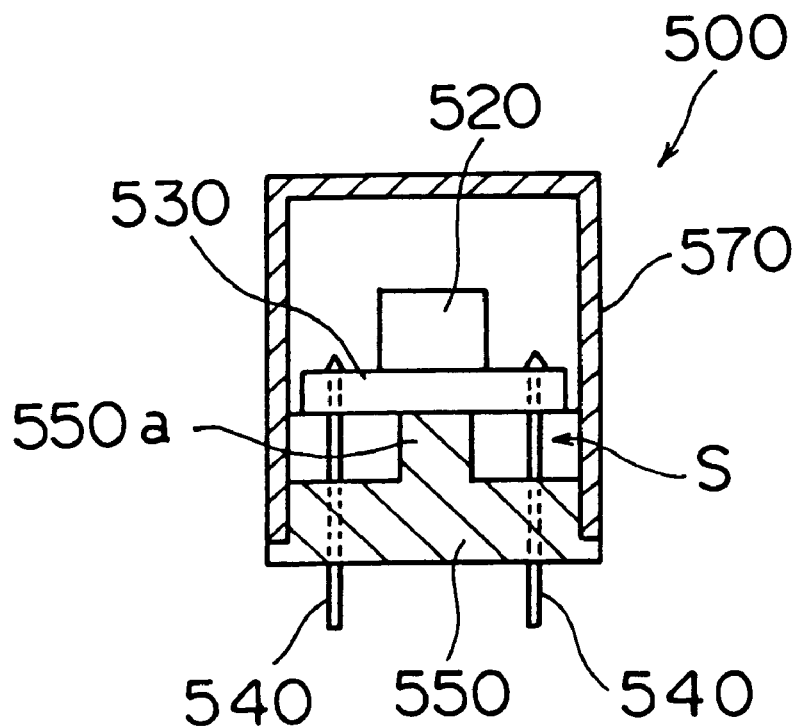
FIG. 16 is a cross sectional view showing the construction of an acceleration sensor according to a fifth embodiment of the present invention.

As shown in FIG. 16, in an acceleration sensor 500 according to the present embodiment, a circuit board 530 and a metal base plate 550 respectively have circular shapes and are connected by connecting terminals 540. A substrate supporting portion 550a is formed in the center of the metal base plate 550. The substrate supporting portion 550a supports the bottom surface of the circuit board 530 in an assembled state.

In the acceleration sensor 500, the center of the circuit board 530 is supported by the substrate supporting portion 550a, whereby rolling resonance is not produced in the circuit board 530. Further, a space S is formed around the substrate supporting portion 550a, thereby to make it possible to contain circuit components constituting a signal processing circuit in the reverse surface of the circuit board 530 utilizing the space S. As a result, it is possible to reduce the area of the circuit board 550a.

Sixth Embodiment

Figure 17:
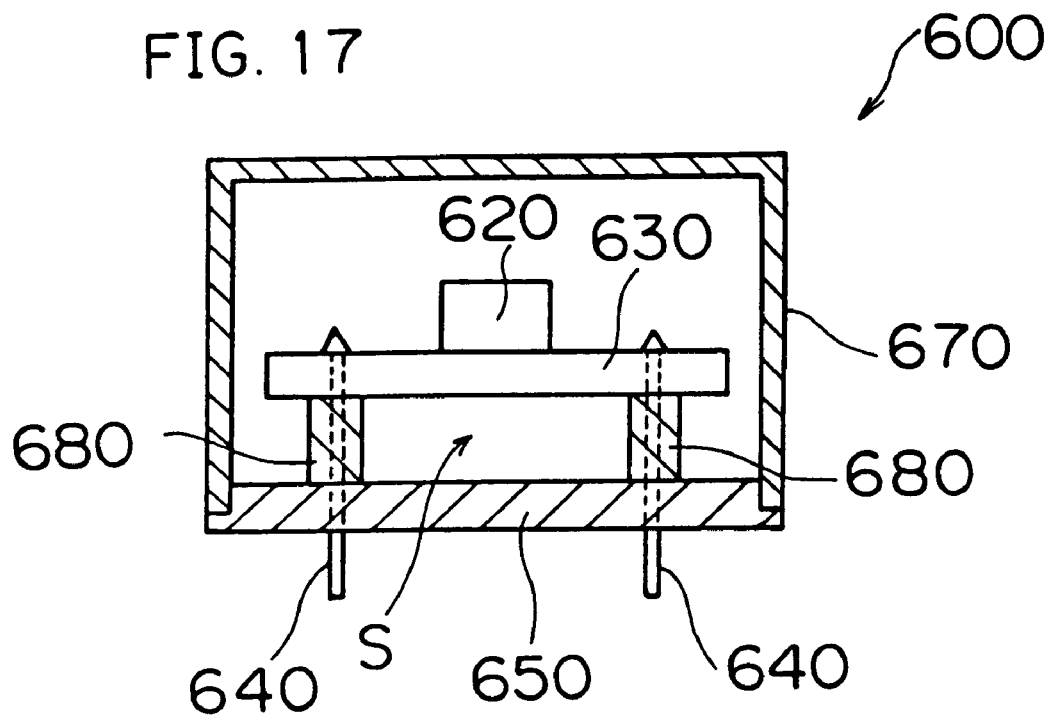
FIG. 17 is a cross sectional view showing the construction of an acceleration sensor according to a sixth embodiment of the present invention.

As shown in FIG. 17, in an acceleration sensor 600 according to the present embodiment, substrate supporting bases 680 are provided between a circuit board 630 and a metal base plate 650. The substrate supporting bases 680 are constructed separately from the metal base plate 650. Connecting terminals 640 are respectively inserted through the substrate supporting bases 680. The substrate supporting bases 680 form a space S between the circuit board 630 and the metal base plate 650 and support the circuit board 630. The space S makes it possible to carry circuit components constituting a signal processing circuit on the reverse surface of the circuit board 630 and consequently, makes it possible to miniaturize the circuit board 630. The substrate supporting bases 680 support and fix the circuit board 630 to prevent the rolling vibration of the circuit board 630. The substrate supporting base 680 is composed of ferrite. Therefore, an acceleration signal detected by an acceleration detecting element 620 is outputted outward after a noise component of the acceleration signal is reduced by passing through the connecting terminals 640 respectively penetrating through the substrate supporting bases 680 made of ferrite.

As a material of the substrate supporting base 680, a material having a noise reducing effect, for example, a ferrite material is preferred. However, the material may be another material which does not have such a function, provided that it can support and fix the circuit board 630.

Seventh Embodiment

Figure 18:
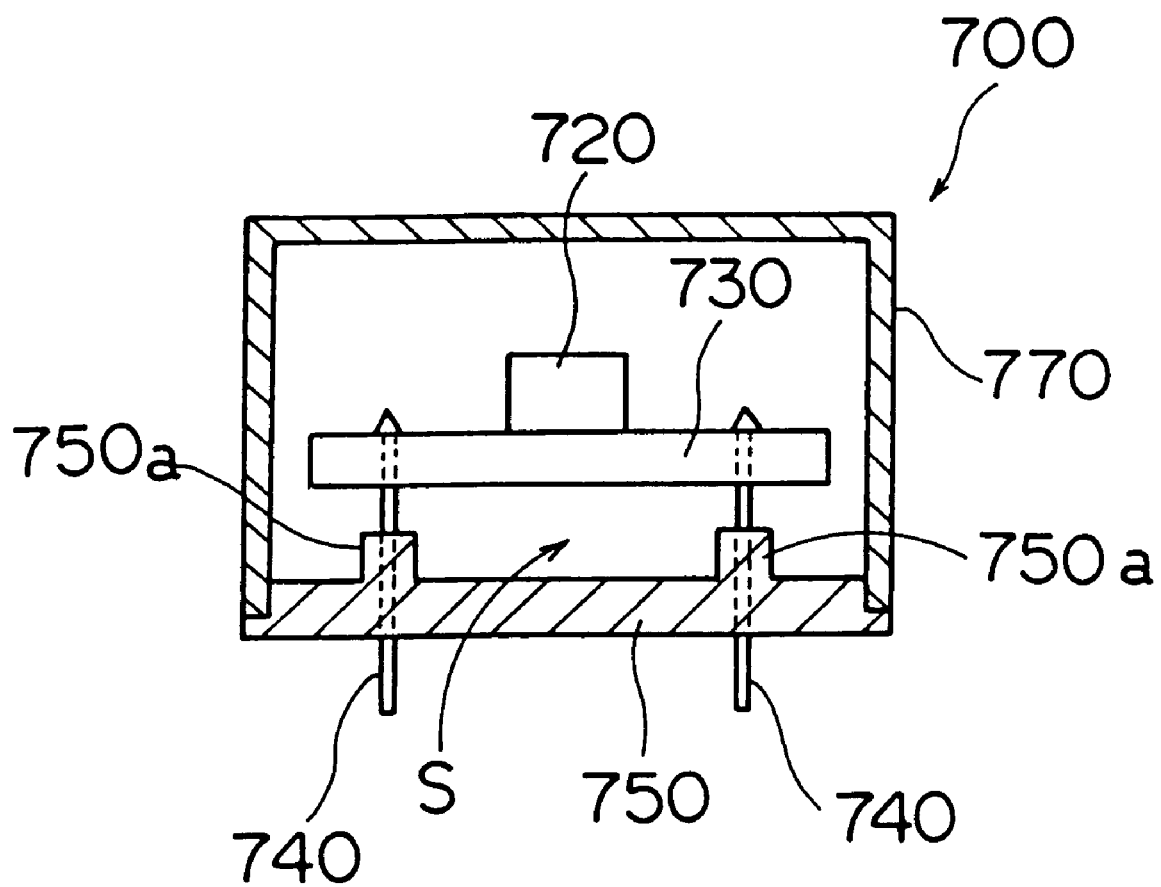
FIG. 18 is a cross sectional view showing the construction of an acceleration sensor according to a seventh embodiment of the present invention.

As shown in FIG. 18, an acceleration sensor according to the present embodiment is characterized by the shape of a metal base plate 750. Specifically, in the metal base plate 750, projected portions 750a projected toward a circuit board 730 are formed. The projected portions 750a are respectively provided so as to correspond to a plurality of connecting terminals 740. Each of the connecting terminals 740 is projected toward the reverse surface of the metal base plate 750 after penetrating through the corresponding projected portion 750a. A portion between the connecting terminal 740 and the projected portion 750a in the metal base plate 750 is subjected to insulation processing. In addition, the connecting terminal 740 is fixed and supported on the metal base plate 750 by a portion, through which the connecting terminal 740 penetrates, of the metal base plate 750. The height of the projected portion 750a is made smaller than the distance between the circuit board 730 and the upper surface of the metal base plate 750. Therefore, the connecting terminal 740 extending toward the reverse surface of the metal base plate 750 from the circuit board 730 has an exposed portion between the reverse surface of the circuit board 730 and an upper end surface of the projected portion 750a.

A space S is formed between the circuit bard 730 and the metal base plate 750 which are supported by such a structure. It is possible to carry circuit components (not shown) on the reverse surface of the circuit board 730 by forming the space S. As a result, it is possible to reduce the area of the circuit board 730.

Furthermore, the circuit board 730 is supported by the exposed portion of the connecting terminal 740 between the circuit board 730 and the projected portion 750a in the metal base plate 750. The length of the exposed portion is made sufficiently smaller than the height of the space S. A portion of the connecting terminal 740 is thus covered with the projected portion 750a, thereby to make it possible to decrease the length of the exposed portion to prevent the rolling vibration of the circuit board 730. This is based on the following principle.

Specifically, rolling resonance may be produced in the circuit board 730 if the circuit board 730 is supported by the connecting terminals 740. However, it is known that the resonance frequency in the circuit board 730 is inversely proportional to one-half the cube of the length of the exposed portion of the connecting terminal 740 which swings between the circuit board 730 and the metal base plate 750. If the length of the exposed portion is decreased, therefore, the resonance frequency in the circuit board 730 can be set in the range of not less than 10 kHz which does not affect a measured region (0 to 1 kHz) of an acceleration detecting element 720. From this point of view, the decrease in the length of the exposed portion of the connecting terminal 740 is effective. If the length of the exposed portion is decreased, however, the space S between the circuit board 730 and the metal base plate 750 is narrowed, thereby to make it impossible to carry circuit components on the reverse surface of the circuit board 730. Therefore, the projected portions 750a are provided on the surface of the metal base plate 750 so that the height of the space S is set to not less than a prescribed value.

The projected portions 750a may be not only formed integrally with the metal base plate 750 but also formed separately from the metal base plate 750 and then, fixed thereto. Alternatively, the projected portion 750a may completely cover a portion of the connecting terminal 740 which is positioned between the circuit board 730 and the metal base plate 750. In this case, it is possible to directly support the circuit board 730 by the projected portions 750a. Therefore, it is possible to further prevent the rolling resonance of the circuit board 730 more effectively.

Although in the above described third to seventh embodiments, the acceleration sensors also have the function of the acceleration sensors in the first and second embodiments, which is not particularly described. Specifically, the circuit board and the metal base plate are arranged while being separated by the space S, thereby to make it possible to prevent the circuit board from warping due to the warping of the mounting substrate. Further, components constituting the signal processing circuit can be also arranged on the reverse surface of the circuit board utilizing the space S, thereby to make it possible to miniaturize the circuit board.

In FIGS. 14 to 18, reference numerals 320, 420, 520, and 720 denote acceleration detecting elements, and 370, 570, 670 and 770 denotes cases.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An acceleration sensor comprising:
   an acceleration detecting element comprising a piezoelectric element subjected to polarization processing, and a weight fastened on said piezoelectric element and composed of a material having a coefficient of thermal expansion equal to that of said piezoelectric element;
   a circuit board on which said acceleration detecting element is mounted, said acceleration detecting element being mounted at a center position of a major surface of said circuit board, such that the direction in which acceleration is to be detected is parallel to the major surface of said circuit board;
   a base plate arranged opposed to said circuit board while being separate from said circuit board by a space;
   at least one connecting terminal extending from said circuit board toward one side of said base plate, and projecting away from an opposite side of said base plate, and fixed to said base plate, said connecting terminal comprising a plurality of connecting terminals arranged along each of a pair of opposite sides of said circuit board in a rectangular shape, and said acceleration detecting element being mounted on said circuit board so that the direction in which acceleration is to be detected is a direction orthogonal to the direction in which said connecting terminals are aligned along said circuit board; and
   a substrate supporting member arranged between said circuit board and said base plate for separating the same.

2. The acceleration sensor according to claim 1, wherein said substrate supporting member comprises at least one projection extending from said base plate into engagement with said circuit board.

3. The acceleration sensor according to claim 1, wherein said substrate supporting member comprises a first projection extends from a first side of said base plate into engagement with said circuit board and a second projection extending from the opposite side of said base plate into engagement with said circuit board.

4. The acceleration sensor according to claim 3, wherein said first projection extends from substantially the entire extent of one side of said base plate and said second projection extends from substantially the entire extent of an opposite side of said base plate.

5. The acceleration sensor according to claim 1, wherein said substrate supporting member comprises a U-shaped member extending from first, second and third sides of said base plate into engagement with said circuit board; and said at least one connecting terminal is positioned in proximity to a fourth side of said base plate.

6. The acceleration sensor according to claim 1, wherein said supporting member comprises a projection extending from a central portion of the base plate into engagement with said circuit board.

7. The acceleration sensor according to claim 1, wherein said supporting member comprises a plurality of projections extending between said base plate and said circuit board and further including a plurality of connecting terminals, including said at least one connecting terminal, extending through said projections and from said circuit board towards one side of said base plate, said connecting terminals projecting away from an opposite side of said base plate and being insulated from and fixed to said base plate.

8. The acceleration sensor according to claim 2, wherein said connecting terminal is insulated from said base plate.

9. The acceleration sensor according to claim 7, wherein said connecting terminal is insulated from said base plate.

10. The acceleration sensor according to claim 1, wherein said substrate supporting member is formed integrally with said base plate.

11. The acceleration sensor according to claim 1, wherein said substrate supporting member is formed along at least one side of said circuit board in a rectangular shape.

12. The acceleration sensor according claim 1, wherein said connecting terminal is projected outward after penetrating through said substrate supporting member and said base plate.

13. The acceleration sensor according to claim 12, wherein the height of said substrate supporting member is made smaller than said space between said circuit board and said base plate.

14. The acceleration sensor according to claim 12, wherein said substrate supporting member is composed of a ferrite material.

15. The acceleration sensor according to claim 1, wherein said acceleration detecting element is mounted at a center position of a major surface of said circuit board.

16. The acceleration sensor according to claim 1, wherein a circuit element is arranged on the major surface, which is opposed to said base plate, of said circuit board.

17. The acceleration sensor according to claim 1, wherein said acceleration detecting element is arranged on either one of a pair of major surfaces of said circuit board.

18. The acceleration sensor according to claim 10, wherein said substrate supporting member is formed along at least one side of said circuit board in a rectangular shape.

19. The acceleration sensor according to claim 10, wherein said connecting terminal is projected outward after penetrating through said substrate supporting member and said base plate.

20. The acceleration sensor according to claim 19, wherein the height of said substrate supporting member is made smaller than said space between said circuit board and said base plate.

21. The acceleration sensor according to claim 19, wherein said substrate supporting member is composed of a ferrite material.

* * * * *